(12) United States Patent
Shirokov et al.

(10) Patent No.: US 7,948,305 B2
(45) Date of Patent: May 24, 2011

(54) VOLTAGE REGULATOR CIRCUIT

(75) Inventors: Mikhail S. Shirokov, Methuen, MA (US); Grant A. Small, Nashua, NH (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 12/430,022

(22) Filed: Apr. 24, 2009

(65) Prior Publication Data
US 2010/0271116 A1 Oct. 28, 2010

(51) Int. Cl.
*G05F 3/16* (2006.01)
*H03L 5/00* (2006.01)

(52) U.S. Cl. ........ 327/540; 327/513; 323/907; 323/315; 330/127

(58) Field of Classification Search .................. None
See application file for complete search history.

(56) References Cited

U.S. PATENT DOCUMENTS

| | | | |
|---|---|---|---|
| 5,077,231 A | 12/1991 | Plumton et al. | |
| 5,457,422 A * | 10/1995 | Rotay | 327/538 |
| 5,966,006 A * | 10/1999 | Migliavacca | 323/315 |
| 6,373,329 B2 * | 4/2002 | Hosoi et al. | 327/538 |
| 6,384,670 B1 * | 5/2002 | Eagar et al. | 327/539 |
| 6,842,067 B2 | 1/2005 | Andrys et al. | |
| 6,989,708 B2 * | 1/2006 | Xi | 327/539 |
| 7,122,997 B1 * | 10/2006 | Werking | 323/313 |
| 7,250,818 B2 | 7/2007 | Ayun et al. | |
| 7,259,615 B2 * | 8/2007 | Sasho et al. | 327/545 |
| 7,453,252 B1 * | 11/2008 | Megaw | 323/313 |
| 2009/0273237 A1 * | 11/2009 | Inoue | 307/10.1 |

OTHER PUBLICATIONS

T. Henderson, et al., "High Performance BiHEMT HBT / E-D pHEMT Integration", CS Mantech Conference, May 14-17, 2007, Austin, Texas, USA, pp. 247-250.

* cited by examiner

*Primary Examiner* — Lincoln Donovan
*Assistant Examiner* — Terry L Englund
(74) *Attorney, Agent, or Firm* — Schwabe Williamson & Wyatt

(57) ABSTRACT

A circuit having a substrate, a generator with a field effect transistor (FET) portion and a heterojunction bipolar transistor (HBT) portion integrated in the substrate, a voltage-to-voltage conveyor integrated in the substrate, a bias circuit, and a power amplifier is disclosed.

18 Claims, 7 Drawing Sheets

VOLTAGE REGULATOR CIRCUIT

FIELD

Embodiments of the present disclosure relate generally to the field of circuits, and more particularly to a voltage regulator circuit.

BACKGROUND

A radio frequency (RF) power amplifier (PA) is a component of an RF front-end module (FEM) that provides up-converted signal transmission in wireless telecommunications by amplifying a radio signal into an antenna. Transistors within an RF PA are typically biased by supplying an unregulated battery voltage to the FEM. In some instances, a supplemental regulated voltage source can be made available external to the FEM. However, this increases the overall system cost.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
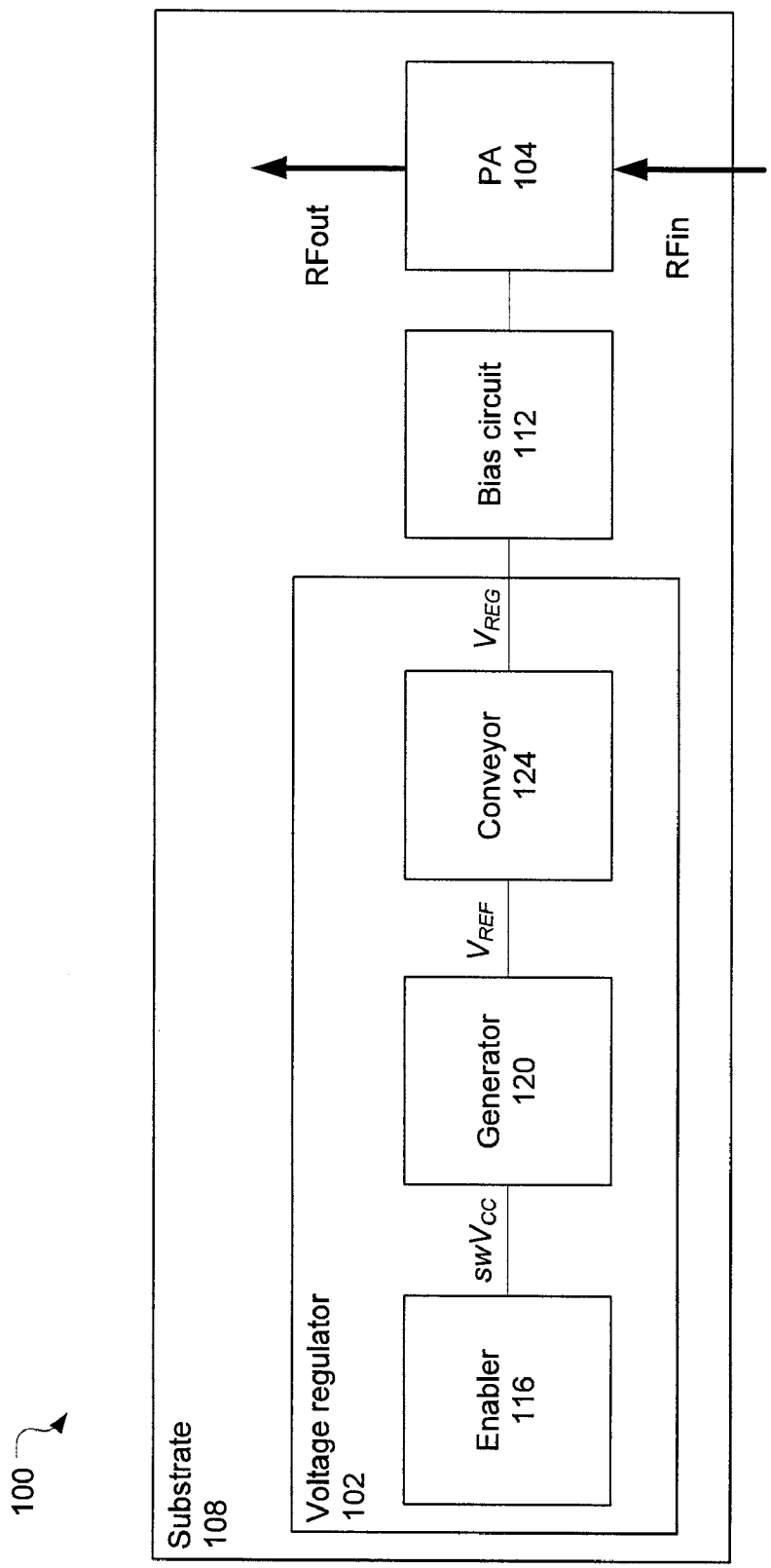
FIG. 1 illustrates a front-end module in accordance with some embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Certain components, e.g., transistors, may be shown or described in conventions typically associated with particular materials, structures, polarities, etc. However, unless noted otherwise, other materials, structures, polarities, etc. may be used in other embodiments of the present disclosure with appropriate modifications being made to the implementing device/system. With particular reference to transistors, unless otherwise noted, a transistor may be made with any type of material, e.g., germanium, silicon, gallium arsenide, aluminum gallium arsenide, silicon carbide, etc.; any type of structure, e.g., bipolar junction transistor (BJT), junction gate field effect transistor (JFET), metal-oxide semiconductor FET (MOSFET), heterojunction bipolar transistor (HBT), insulated-gate bipolar transistor (IGBT), etc.; and/or any type of polarity, e.g., N-channel, P-channel, NPN, PNP, etc. Furthermore, in some embodiments, suitable transistor-like technologies may used in place of transistors.

FIG. 1 illustrates a front-end module 100 (FEM) having a voltage regulator 102 integrated with a radio frequency (RF) power amplifier (PA) 104 (hereinafter simply "PA 104") in a substrate 108 in accordance with some embodiments. The voltage regulator 102 may be coupled with a bias circuit 112, to provide the bias circuit 112 with a regulated voltage ($V_{REG}$) sufficient to support proper biasing of the PA 104. $V_{REG}$ may be a stable voltage that is largely insensitive to ambient temperature and supply voltage variations. Integrating the voltage regulator 102, the bias circuit 112, and the PA 104 in the substrate 108 may facilitate the provision of a stable bias control while reducing costs and size constraints commonly associated with external bias controls.

While the embodiments described herein discuss the voltage regulator 102 providing $V_{REG}$ to the bias circuit 112 associated with the PA 104, in other embodiments the voltage regulator 102 may provide $V_{REG}$ to additional/alternative circuits integrated in the substrate 108. Furthermore, in other embodiments, the bias circuit 112 may bias additional/alternative circuits integrated in the substrate 108. These other circuits could include, but are not limited to, a power detector and/or a temperature sensor.

The voltage regulator 102 may have an enabler 116, a generator 120, and a conveyor 124 coupled with each other at least as shown. The enabler 116 may be configured to alternatively provide and withhold a switched supply voltage ($swV_{cc}$) to respectively enable and disable the voltage regulator 102. When enabled, the enabler 116 may provide $swV_{cc}$ to the generator 120 and/or conveyor 124.

The generator 120, being provided with $swV_{cc}$, may generate a reference voltage ($V_{REF}$) having a set of desired characteristics. For example, $V_{REF}$ may be sufficiently stable and relatively insensitive to variations in ambient temperature and/or supply voltage. The generator 120 may provide $V_{REF}$ to the conveyor 124.

Figure 2:
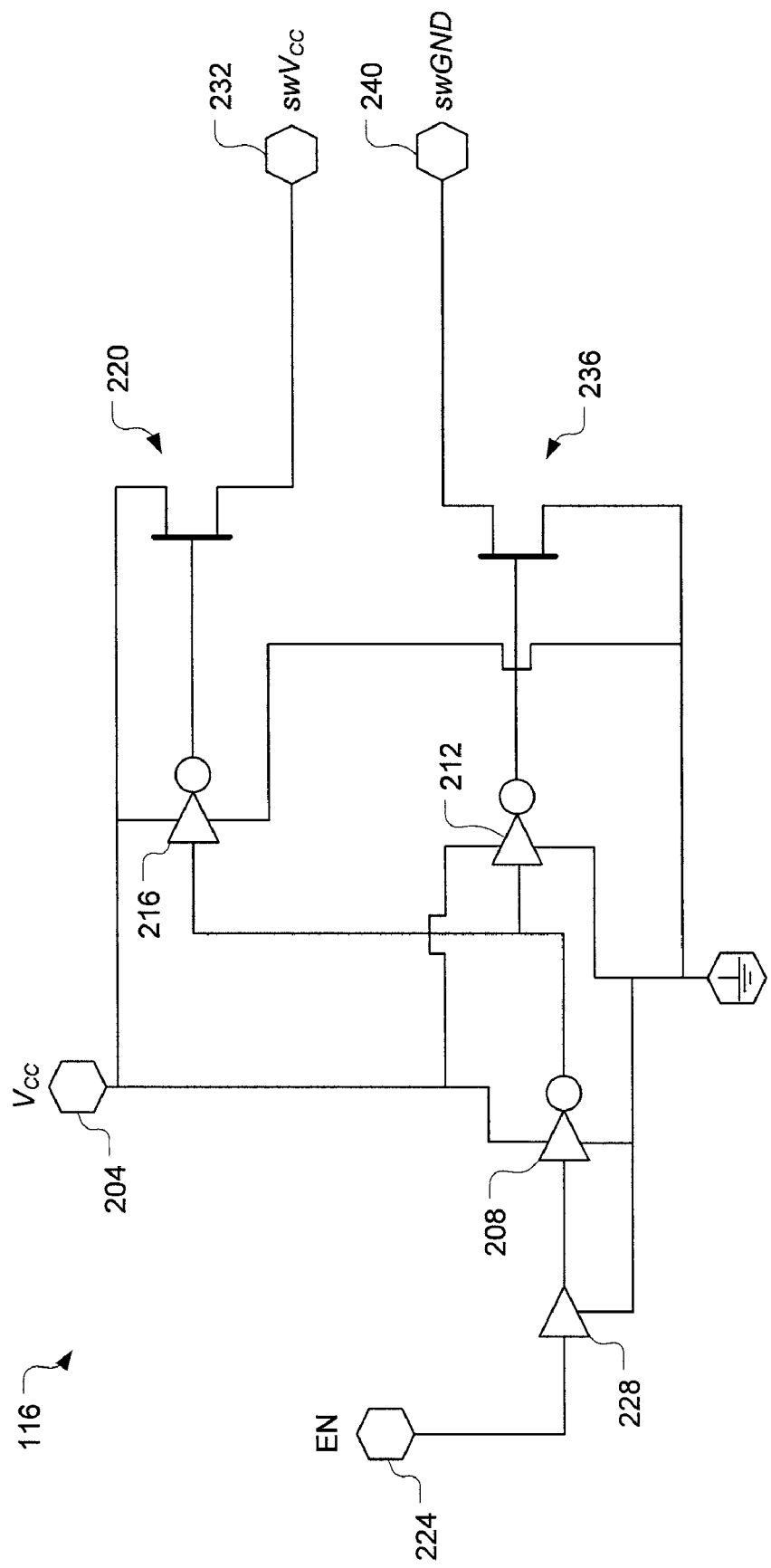
FIG. 2 illustrates an enabler of a voltage regulator in accordance with some embodiments.
Figure 3:
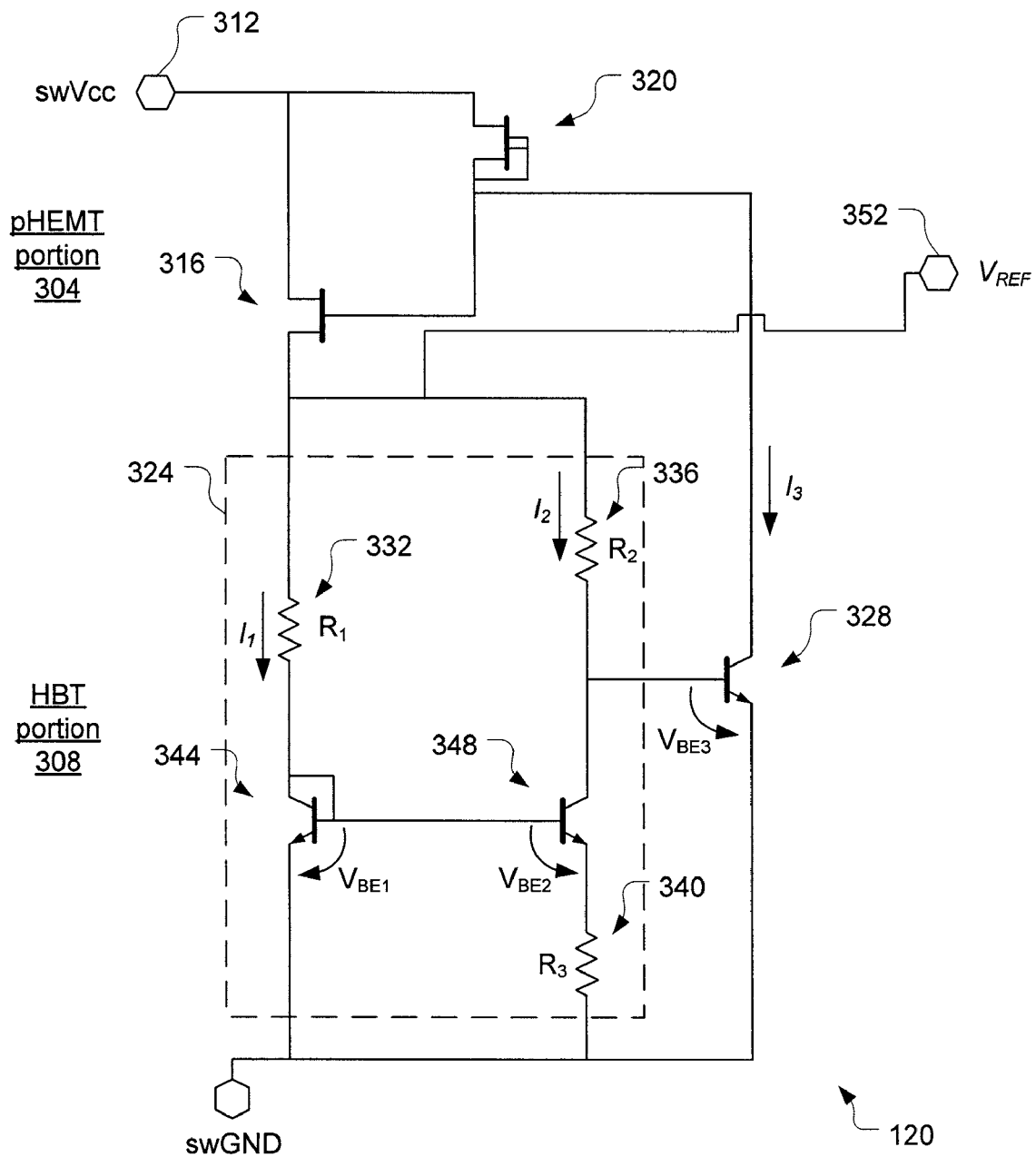
FIG. 3 illustrates a generator of a voltage regulator in accordance with some embodiments.
Figure 4:
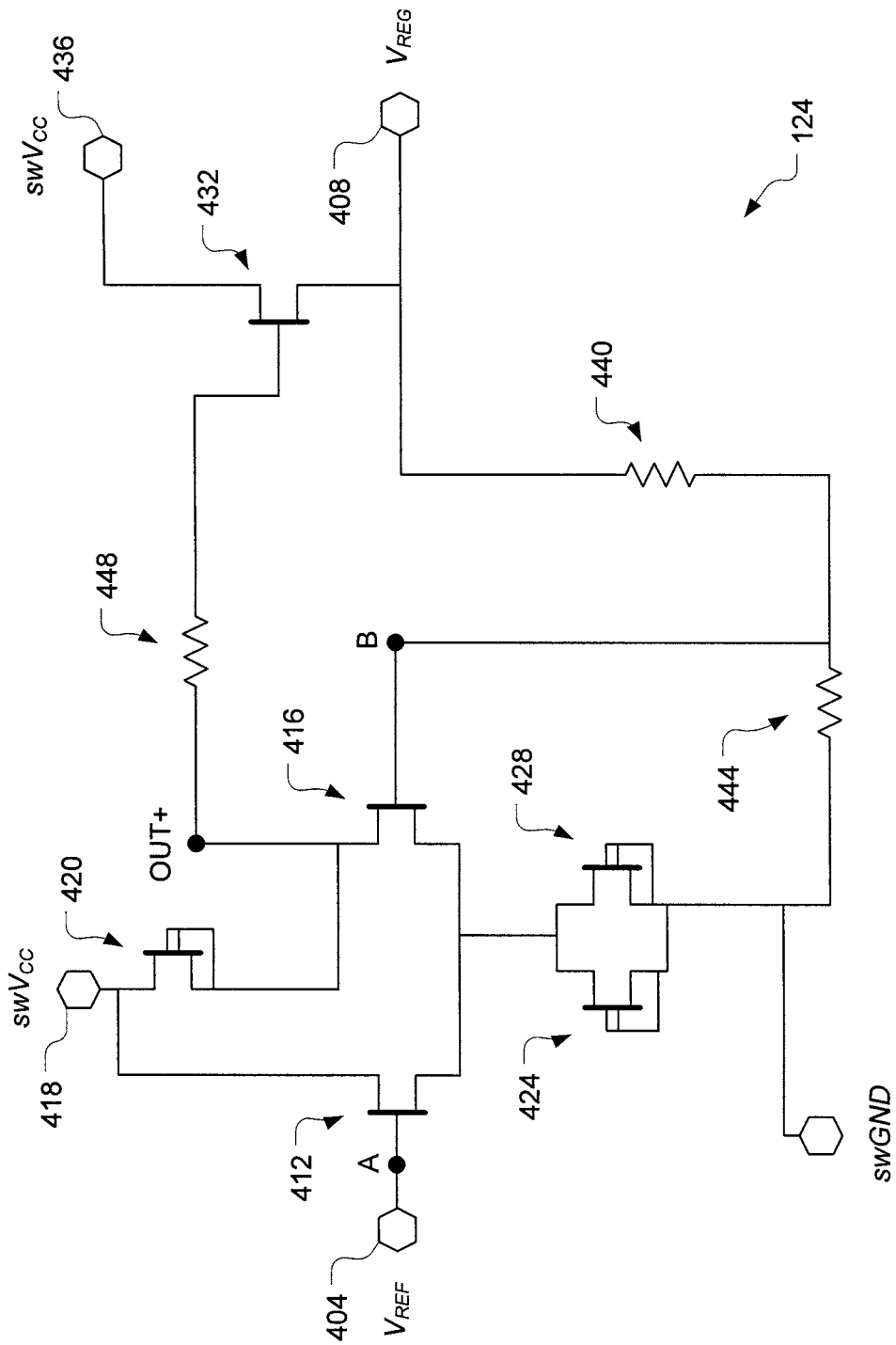
FIG. 4 illustrates a conveyor of a voltage regulator in accordance with some embodiments.

The conveyor 124 may be configured to scale $V_{REF}$ to $V_{REG}$. While $V_{REG}$ may be at a level that is higher (or lower) than $V_{REF}$, it may share $V_{REF}$'s set of desired characteristics. FIGS. 2-4 will describe the function and components of the various blocks of the voltage regulator 102 in additional detail in accordance with some embodiments.

FIG. 2 illustrates the enabler 116 in accordance with some embodiments. The enabler 116 may include a number of components, including enhancement/depletion (e/d) pseudomorphic heterostructure field effect transistors (pHEMTs), arranged in a manner to alternately enable and disable the voltage regulator 102. The enabler 116 may allow provision of VREG to the bias circuit 112 when the voltage regulator 102 is enabled, and may reduce direct current (DC) leakage current when the voltage regulator 102 is disabled.

The enabler 116 may include a supply port 204 configured to admit a supply voltage ($V_{cc}$). The admitted $V_{cc}$ may be provided to power terminals of inverters 208, 212, and 216 and also to a drain terminal of a transistor 220. The enabler 116 may also include an enable port 224 configured to admit an enable signal (EN) from an external component/device such as, but not limited to, a controller. As used herein, an "external device/component" is a device/component that is not integrated in the substrate 108.

The admitted EN may be buffered at buffer 228 and then provided to the inverters 208, 212, and 216. When the EN is at a high logic state, in one example, the inverter 216 may control a gate of transistor 220 to admit a switched supply voltage (sw$V_{cc}$) to a high-rail output port 232; and the inverter 212 may control a gate of transistor 236 to admit a switched system ground (swGND) to a low-rail output port 240. When the EN is at a low logic state, in this example, both the high-rail output port 232 and the low-rail output port 240 may float. FIG. 3 illustrates the generator 120 in accordance with various embodiments. The generator 120 may have a FET portion, e.g., a PHEMT portion 304, and a heterojunction bipolar transistor (HBT) portion 308 that are configured to cooperatively generate a temperature and/or supply voltage compensated $V_{REF}$ as will be described. Generally, the PHEMT portion 304 may provide a stable bias current to the HBT portion 308, which may serve as a band-gap reference-voltage generator.

The generator 120, having both the PHEMT portion 304 and the HBT portion 308 in the substrate 108, may be referred to as a BiHEMT component. The substrate 108 may include gallium arsenide (GaAs) to accommodate BiHEMT components, such as the generator 120.

The PHEMT portion 304 may include a high-rail input port 312 to admit sw$V_{cc}$ to the generator 120. Drain terminals of a transistor 316 and a gap current source (GCS) transistor 320 may be coupled with the high-rail input port 312.

A source terminal of the GCS transistor 320 may be coupled with a collector of a bipolar junction transistor (BJT) 328 of the HBT portion 308. The GCS transistor 320 may source a current ($I_3$) to the BJT 328. $I_3$ may be proportional to a size of a physical gap within a gate of the GCS transistor 320. Such GCS transistors may be capable of functioning as stable and precise low-current sources.

The source terminal of the GCS transistor 320 may also be coupled with the transistor 316 in a manner to set an appropriate potential at a gate terminal of the transistor 316, which may source a current ($I_1$) to a proportional-to-absolute temperature (PTAT) block 324 of the HBT portion 308.

The PTAT block 324 may include resistors 332, 336, and 340 and BJTs 344 and 348. The PTAT block 324 may be used to generate $V_{REF}$ at an output port 352 by scaling a base-emitter voltage of BJT 328, $V_{BE3}$.

The PTAT block 324 may act as a current mirror to set current $I_2$ approximately equal to $I_1$. Thus, a product of $I_1$ and $R_1$ is approximately equal to a product of $I_2$ and $R_2$. The base emitter voltage of BJT 344, $V_{BE1}$, may then be given by:

$$V_{BE1} = V_{BE2} + I_2 * R_3, \quad \text{Equation 1}$$

where $V_{BE2}$ is the base-emitter voltage of BJT 348 and $R_3$ is the resistance of the resistor 340. The delta base-emitter voltage, $\Delta V_{BE}$, may be given by:

$$\Delta V_{BE} = V_{BE1} - V_{BE2} = I_2 * R_3, \quad \text{Equation 2}$$

and $$\Delta V_{BE} = V_T * \ln\left(\frac{I_1}{I_{S1}}\right) - V_T * \ln\left(\frac{I_2}{I_{S2}}\right) = V_T * \ln\left(\frac{I_1 * I_{S2}}{I_2 * I_{S1}}\right) \quad \text{Equation 3}$$

where $V_T$ is a thermal potential that is the product of Boltmann's constant and the absolute temperature divided by the electronic charge; $I_{S1}$ is a saturation current of the BJT 344, and $I_{S2}$ is a saturation current of the BJT 348.

Given the assumption that $V_{BE1} = V_{BE3}$, which may be valid due to both emitter terminals being coupled with swGND and similar potentials existing at both collector terminals, results in:

$$I_1 * R_1 = I_2 * R_2. \quad \text{Equation 4}$$

Hence, $$I_2 = \frac{\Delta V_{BE}}{R_3} = \frac{V_T}{R_3} * \ln\left(\frac{I_1 * I_{S2}}{I_2 * I_{S1}}\right) = \frac{V_T}{R_3} * \ln\left(\frac{R_2 * I_{S2}}{R_1 * I_{S1}}\right); \quad \text{Equation 5}$$

and $V_{REF}$ may be given by:

$$V_{REF} = I_2 * R_2 + V_{BE3} = \frac{R_2}{R_3} V_T * \ln\left(\frac{R_2 * I_{S2}}{R_1 * I_{S1}}\right) + V_{BE3}. \quad \text{Equation 6}$$

Equation 6 reduces to:

$$V_{REF} = kV_T + V_{BE3}, \quad \text{Equation 7}$$

where $$k = \frac{R_2}{R_3} * \ln\left(\frac{R_2 * I_{S2}}{R_1 * I_{S1}}\right). \quad \text{Equation 8}$$

The k factor, as can be seen by Equation 8, is defined as a product of a resistance ratio and a logarithmic ratio. The different ratios are comprised of various resistances and saturation currents of the PTAT block 324. Utilizing the ratios of the resistance/saturation currents, reduces the dependence on the size of the components, which may vary slightly over process. This may, in turn, reduce sensitivity of $V_{REF}$ to variations in sw$V_{cc}$.

It may be noted that a very high repeatability rate may be achieved given the behavior of $V_{REF}$ being based, at least in part, on ratios of resistances/saturation currents. This may be due, at least in part, to tight process controls that relate to the manufacture of the corresponding resistors and transistors.

However, a more prominent variation in $V_{REF}$ may occur from process variations of current sources based on PHEMT devices. The variations in current sources may be translated into the $V_{REF}$ through the log function of Equation 3. Accordingly, GCS transistors, e.g., GCS transistor 320, with their associated precision at low current levels, are especially suited for use as current sources in various embodiments. Other embodiments may utilize other PHEMT current sources that are enabled through the use of BiHEMT processes.

The voltage component of $V_{REF}$ that is provided by the PTAT block 324, i.e., $V_T$, may have a positive temperature coefficient, while the voltage component of $V_{REF}$ provided by the BJT 328, i.e., $V_{BE3}$, may have a negative temperature coefficient. This complementary temperature relationship may provide a temperature-compensated $V_{REF}$ that is less sensitive to variations in ambient temperature.

FIG. 4 illustrates the conveyor 124 in accordance with various embodiments. The conveyor 124 may be a voltage-to-voltage conveyor that scales $V_{REF}$, with its desired insensitivity characteristics, to a magnitude that provides the bias circuit 112 with sufficient current driving capacity. The conveyor 124 shown in FIG. 4 may be structured with e/d PHEMT devices configured to receive $V_{REF}$ at an input port 404, and to output $V_{REG}$ at an output port 408. The conveyor 124 may include transistors 412 and 416 arranged as a differential pair. The differential pair may have a very high gain, at low frequencies, and operate to set point B equal, in magnitude, to point A. Point A may be considered a positive input to the differential pair, and point B may be considered a negative input to the differential pair.

The conveyor 124 may have a supply port 418 coupled to a drain terminal of the transistor 412 and coupled to a GCS transistor 420. The GCS transistor 420 may source a current into a drain terminal of the transistor 416 in order to set an operating point of the differential pair. The conveyor 124 may also have GCS transistors 424 and 428 that are configured to bias the differential pair by pulling equal amounts of current from transistors 412 and 416. The GCS transistors 420, 424, and 428, similar to GCS transistor 320, may be stable low-current sources.

The conveyor 124 may include a transistor 432 with its drain terminal coupled to supply port 436. The transistor 432 may source a relatively small amount of current into resistors 440 and 444, which provide for voltage division at the negative input to the differential pair, i.e., point B. The relationship between $V_{REG}$ and $V_{REF}$ may be defined by the following equation.

$$\frac{V_{REG}}{R_1 + R_2} = \frac{V_{REF}}{R_2}, \quad \text{Equation 9}$$

where $R_1$ is the resistance of resistor 440 and $R_2$ is the resistance of resistor 444. Equation 9 reduces to:

$$V_{REG} = V_{REF} * \left(1 + \frac{R_1}{R_2}\right). \quad \text{Equation 10}$$

Thus, $V_{REG}$ may be proportional to a ratio of resistors 440 and 444.

The transistor 432 may be controlled by having its gate terminal coupled with a drain terminal of transistor 416 through a resistor 448. A non-inverting output (OUT+) may provide feedback to point B that is equal to $V_{REF}$.

Figure 5:
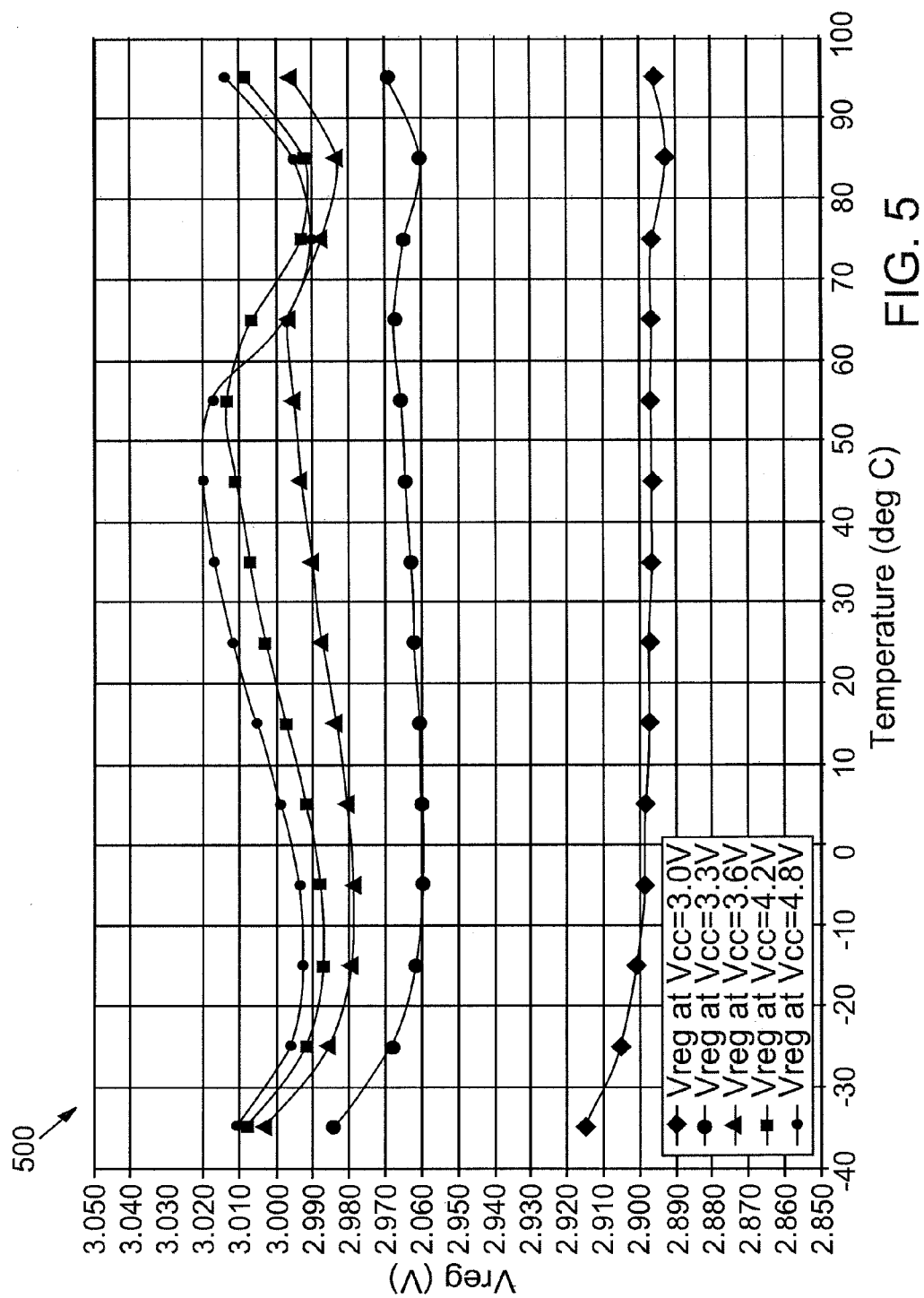
FIG. 5 illustrates a graph plotting regulated voltage versus ambient temperature for a number of different supply voltages in accordance with various embodiments.
Figure 6:
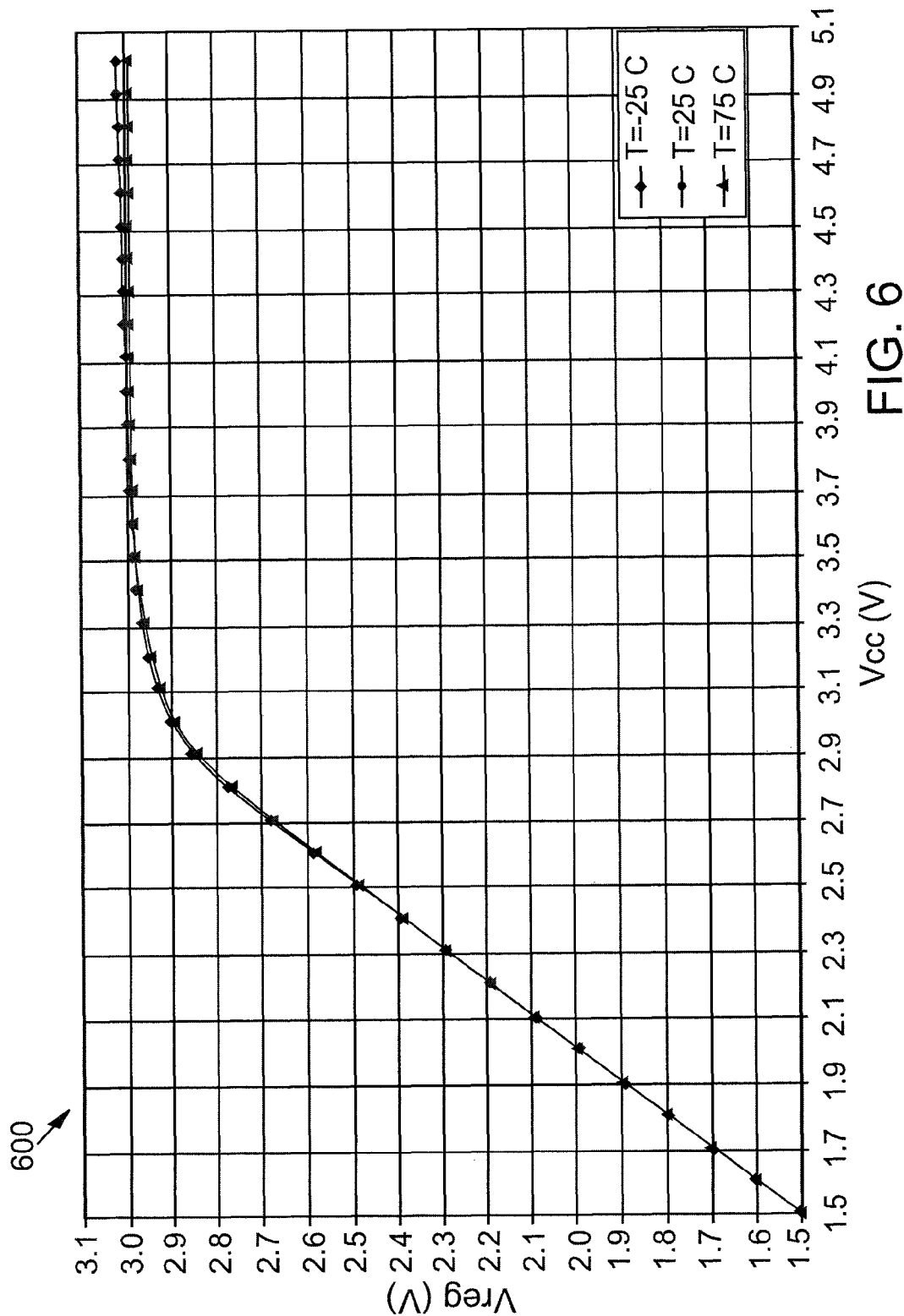
FIG. 6 illustrates a graph plotting regulated voltage versus supply voltage for a number of different ambient temperatures in accordance with various embodiments.

FIGS. 5 and 6 provide various results from a voltage regulator designed in accordance with various embodiments. In particular, FIG. 5 illustrates a graph 500 plotting $V_{REG}$ versus ambient temperature for a number of different supply voltages; and FIG. 6 illustrates a graph 600 plotting $V_{REG}$ versus supply voltage for a number of different ambient temperatures. A design goal of these embodiments may be to achieve the largest possible $V_{REG}$. Due to a small voltage overhead used for operation of the voltage regulator, ~0.1 V, some variation of the $V_{REG}$ may be observed with respect to the supply voltage 3.0 V<$V_{cc}$<5.0 V. If a lower $V_{REG}$ were desired, e.g., 2.8 V at a $V_{cc}$ of 3.0 V or greater, a tighter control of the $V_{REG}$ may be achieved. As can be seen in FIGS. 5 and 6, a very low temperature variation is observed in $V_{REG}$, which may indicate a desired operation of the voltage regulator.

Figure 7:
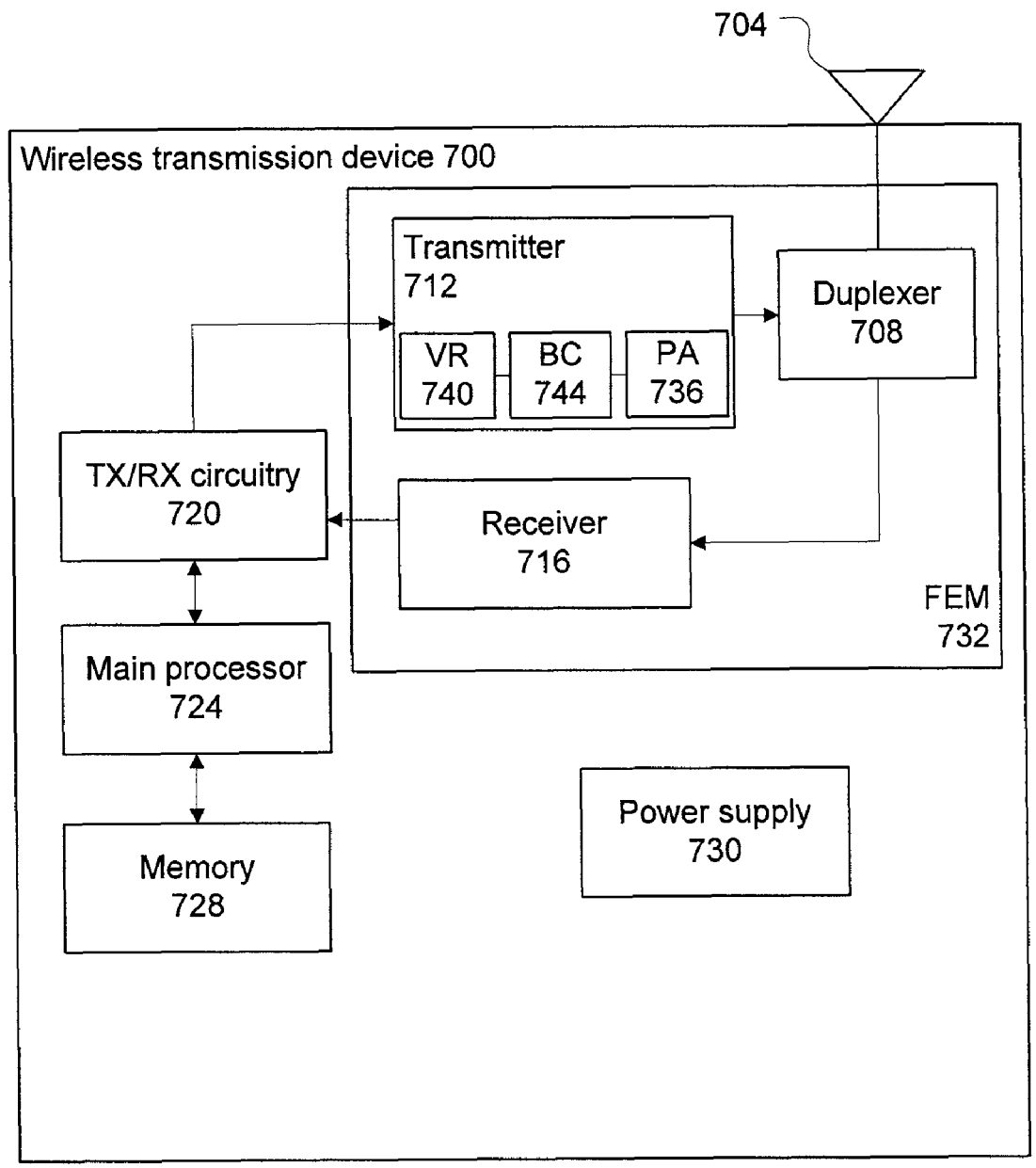
FIG. 7 illustrates a wireless device in accordance with some embodiments.

FIG. 7 illustrates a wireless transmission device 700 in accordance with various embodiments. The wireless transmission device 700 may have an antenna structure 704, a duplexer 708, a transmitter 712, a receiver 716, transmit/receive (TX/RX) circuitry 720, a main processor 724, and a memory 728 coupled with each other at least as shown. The wireless transmission device 700 may also include a power supply 730, e.g., a battery, coupled with the various components to provide DC power. The transmitter 712, receiver 716 and duplexer 708 may be collectively referred to as the FEM 732.

In various embodiments, the wireless transmission device 700 may be, but is not limited to, a mobile telephone, a paging device, a personal digital assistant, a text-messaging device, a portable computer, a base station, a radar, a satellite communication device, or any other device capable of wirelessly transmitting RF signals.

The main processor 724 may execute a basic operating system program, stored in the memory 728, in order to control the overall operation of the wireless transmission device 700. For example, the main processor 724 may control the reception of signals and the transmission of signals by TX/RX circuitry 720, receiver 716, and transmitter 712. The main processor 724 may be capable of executing other processes and programs resident in the memory 728 and may move data into or out of memory 728, as desired by an executing process.

The TX/RX circuitry 720 may receive outgoing data (e.g., voice data, web data, e-mail, signaling data, etc.) from the main processor 724. The TX/RX circuitry 720 may transmit an RF signal that represents the outgoing data to the transmitter 712. The transmitter 712 may include a PA 736 to amplify the RF signal for transmission. The amplified RF signal may be forwarded to the duplexer 708 and then to the antenna structure 704 for an over-the-air (OTA) transmission.

The wireless transmission device 700 may operate under one or more of a number of communication standards and may operate in variety of diverse operational environments. Accordingly, it may be desirable for the FEM 732 to be adaptable to the variety of standards and/or environments. To allow for this adaptable operation, the FEM 732 may include a BiHEMT-based voltage regulator, e.g., VR 740, that is integrated with a bias circuit (BC) 744, and the PA 736 as shown. The PA 736, VR 740, and BC 744 may be similar to, and substantially interchangeable with, similar named components discussed elsewhere in this disclosure. So equipped, the FEM 732 may provide a regulated voltage source that is sufficient for the BC 744 to source a stable biased current to RF transistors of the PA 736 under dynamic signal operation. Furthermore, the linearity desired from the PA 736 to support a variety of communication standards may benefit from precisely set quiescent current that will facilitate low dynamic gain and phase variation under RF excitation.

In a manner complementary to the transmission operation, the TX/RX circuitry 720 may receive an incoming OTA signal from the antenna structure 704 through the duplexer 708 and receiver 716. The TX/RX circuitry 720 may process and send the incoming signal to the main processor 724 for further processing. While the wireless transmission device 700 is shown with transmitting and receiving capabilities, other embodiments may include wireless transmission devices without receiving capabilities.

In various embodiments, the antenna structure 704 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
    a substrate;
    a generator having a field effect transistor (FET) portion and a heterojunction bipolar transistor (HBT) portion integrated in the substrate and configured to cooperatively generate a reference voltage that is temperature compensated;
    a voltage-to-voltage conveyor, integrated in the substrate, coupled with the generator, and configured to scale the reference voltage to a regulated voltage;
    a bias circuit coupled with the voltage-to-voltage conveyor and configured to receive the regulated voltage and to provide a bias current; and
    a power amplifier (PA) coupled with the bias circuit and configured to receive the bias current, to receive an input radio frequency (RF) signal, and to provide an output RF signal.

2. The circuit of claim 1, wherein the FET portion comprises a pseudomorphic heterostructure FET (pHEMT).

3. The circuit of claim 1, wherein the substrate comprises gallium arsenide (GaAs).

4. The circuit of claim 1, wherein the HBT portion of the generator comprises a proportional-to-absolute temperature (PTAT) block.

5. The circuit of claim 4, wherein the PTAT block comprises:
    a current mirror having a first segment configured to receive a first current from the FET portion, and
    a second segment configured to provide a second current as a mirror of the first current.

6. The circuit of claim 5, wherein the first segment includes a first resistor coupled, in series, with a first transistor, and the second segment includes a second resistor coupled, in series, with a second transistor, wherein a base of the first transistor is coupled with a base of the second transistor.

7. The circuit of claim 6, wherein the HBT portion further comprises:
    a third transistor having a base coupled with the second segment at a node between the second resistor and the second transistor, wherein a base-emitter voltage of the first transistor is approximately equal to a base-emitter voltage of the third transistor.

8. The circuit of claim 1, wherein the FET portion of the generator comprises a gap current source transistor.

9. The circuit of claim 1, further comprising:
    a switch integrated in the substrate and configured to alternatively provide and withhold a supply voltage to the generator to respectively enable and disable the circuit.

10. A system comprising:
    a power supply;
    a front-end module (FEM) coupled with the power supply and including a voltage regulator having a field effect transistor (FET) portion and a heterojunction bipolar transistor (HBT) portion integrated into a common substrate, the voltage regulator configured to receive a supply voltage and to provide a regulated voltage;
    a bias circuit coupled with the voltage regulator and configured to receive the regulated voltage and to provide a bias current; and
    a power amplifier (PA) coupled with the bias circuit and configured to receive the bias current, receive an input radio frequency (RF) signal, and to provide an output RF signal; and
    an antenna structure coupled with the FEM and configured to transmit the output RF signal.

11. The system of claim 10, wherein the FET portion comprises a pseudomorphic heterostructure FET (pHEMT).

12. The system of claim 10, wherein the substrate comprises gallium arsenide (GaAs).

13. The system of claim 10, wherein the HBT portion comprises a proportional-to-absolute temperature (PTAT) block.

14. The system of claim 13, wherein the PTAT block comprises:
    a current mirror having a first segment configured to receive a first current from the FET portion, and
    a second segment configured to provide a second current as a mirror of the first current.

15. The system of claim 10, wherein the FET portion comprises a gap current source transistor.

16. The system of claim 10, further comprising:
    a switch integrated in the common substrate and configured to alternatively enable and disable the voltage regulator.

17. A method comprising:
    generating, with a generator that has a field effect transistor (FET) portion and a heterojunction bipolar transistor (HBT) portion integrated into a common substrate, a reference voltage that is temperature compensated;
    scaling, with a voltage-to-voltage conveyor integrated in the common substrate and coupled with the generator, the reference voltage to a regulated voltage;
    generating a bias current based at least in part on the regulated voltage; and
    amplifying a radio frequency signal based at least in part on the bias current.

18. The method of claim 17, further comprising:
    receiving, with a proportional-to-absolute temperature (PTAT) block of the HBT portion, a first current from the FET portion, and
    providing a second current as a mirror of the first current.

* * * * *

UNITED STATES PATENT AND TRADEMARK OFFICE
CERTIFICATE OF CORRECTION

PATENT NO. : 7,948,305 B2 Page 1 of 1
APPLICATION NO. : 12/430022
DATED : May 24, 2011
INVENTOR(S) : Mikhail S. Shirokov and Grant A. Small It is certified that error appears in the above-identified patent and that said Letters Patent is hereby corrected as shown below:

Col. 8, line 49 "[Claim 17.] ...that. has ..." should read -- "...that has ..." --

Signed and Sealed this
Sixteenth Day of October, 2012

David J. Kappos
*Director of the United States Patent and Trademark Office*